US012716856B2

(12) United States Patent
Domes

(10) Patent No.: US 12,716,856 B2
(45) Date of Patent: Aug. 25, 2026

(54) METHOD AND DEVICE FOR MONITORING THERMAL IMPEDANCE

(71) Applicant: Infineon Technologies AG, Neubiberg (DE)

(72) Inventor: Daniel Domes, Werl (DE)

(73) Assignee: Infineon Technologies AG, Neubiberg (DE)

( * ) Notice: Subject to any disclaimer, the term of this patent is extended or adjusted under 35 U.S.C. 154(b) by 359 days.

(21) Appl. No.: 18/455,330

(22) Filed: Aug. 24, 2023

(65) Prior Publication Data

US 2024/0085359 A1 Mar. 14, 2024

(30) Foreign Application Priority Data

Sep. 8, 2022 (DE) ........................ 102022122829.0

(51) Int. Cl.
*G01N 25/18* (2006.01)
*G01R 31/26* (2020.01)
(Continued)

(52) U.S. Cl.
CPC ......... *G01N 25/18* (2013.01); *G01R 31/2837* (2013.01); *G01R 31/2601* (2013.01); *G01R 31/2849* (2013.01); *H10W 40/00* (2026.01)

(58) Field of Classification Search
CPC ................ G01N 25/18; G01R 31/2837; G01R 31/2601; G01R 31/2849; G01R 31/2648;
(Continued)

(56) References Cited

U.S. PATENT DOCUMENTS 5,521,593 A * 5/1996 Kumar .................. H03K 17/79 323/245
5,640,045 A * 6/1997 Krausse, III ........ H10W 40/611 257/633
(Continued)

FOREIGN PATENT DOCUMENTS

CN 103792476 A * 5/2014
CN 109164370 B * 11/2020 ......... G01R 31/2601
(Continued)

OTHER PUBLICATIONS

Translation of CN-103792476-A (Year: 2014).*
(Continued)

*Primary Examiner* — Paresh Patel
*Assistant Examiner* — Hugo Navarro
(74) *Attorney, Agent, or Firm* — Harrity & Harrity, LLP

(57) ABSTRACT

A method of monitoring a thermal impedance of at least a portion of a thermal path between a semiconductor device having at least two output terminals and a heat sink s provided. The method includes causing power dissipation in the semiconductor device by reloading parasitic capacitances of the semiconductor device such that the at least two output terminals are at the same voltage level, measuring a first temperature in response to the power dissipation at a first end of the portion of the thermal path, measuring a second temperature in response to the power dissipation at a second end of the portion of the thermal path, and determining a measure of the thermal impedance based on the first temperature and the second temperature.

22 Claims, 3 Drawing Sheets

(51) Int. Cl.
*G01R 31/28* (2006.01)
*H10W 40/00* (2026.01)

(58) Field of Classification Search
CPC ............ G01R 31/2656; G01R 31/2858; G01R 31/2884; G01R 31/26; G01R 31/2642; H01L 23/34; H01L 22/34; H01L 22/00; H01L 2924/00; H10W 40/00; G01K 3/10
USPC ...................................................... 324/762.01
See application file for complete search history.

(56) References Cited

U.S. PATENT DOCUMENTS 5,900,722 A * 5/1999 Scott .................... B23K 9/1062 322/29
5,927,853 A * 7/1999 Christiaens ............ G01N 25/18 374/43
6,075,700 A * 6/2000 Houghton ............ H05K 1/0218 174/16.3
7,034,556 B1 * 4/2006 Arlow .................. H05B 1/0233 700/297
8,478,559 B2 * 7/2013 Baginski .............. H10D 12/481 702/133
9,224,670 B2 * 12/2015 Kaeriyama ............ H10D 89/60
10,510,637 B2 * 12/2019 Yang ........................ H10D 1/00
10,770,883 B2 * 9/2020 Creech ..................... H02H 3/08
11,269,005 B2 * 3/2022 Homoth ............. G01R 31/2644
11,313,819 B2 * 4/2022 Elger ................. G01R 31/2619
12,284,793 B2 * 4/2025 Bawa .................. F28D 15/0233
2006/0020679 A1 * 1/2006 Hinton ................ H04L 63/0815 709/217
2007/0004055 A1 * 1/2007 Ball ..................... H03K 17/122 257/E23.08
2012/0221288 A1 * 8/2012 Ioannidis ............... G01N 25/18 702/136
2013/0313701 A1 * 11/2013 Bergmann ......... H05K 7/20254 257/713
2013/0328132 A1 * 12/2013 Davies ............... H10D 30/0281 257/386
2015/0102401 A1 * 4/2015 Molin .................. H10D 10/051 257/329
2016/0126852 A1 * 5/2016 Freeman ................. H02M 1/08 363/21.05
2018/0017612 A1 * 1/2018 Burton-Ccoca .......... G01K 7/01
2018/0034446 A1 * 2/2018 Wood .................... H02M 7/217
2019/0107502 A1 * 4/2019 Carr ....................... G01N 27/18
2020/0112245 A1 * 4/2020 Mitsui ..................... H02M 1/32
2020/0408829 A1 * 12/2020 Ugur .................. G01R 31/2621
2021/0136947 A1 * 5/2021 Feurtado ............... H02M 1/088

FOREIGN PATENT DOCUMENTS

CN 118688246 A * 9/2024 ............. G01N 25/20
DE 102013218909 A1 3/2015
DE 102014201781 A1 * 8/2015 ............ H10W 40/00
DE 102017210870 B3 10/2018
JP 2017166824 A * 9/2017
RU 2698512 C1 * 8/2019 ............. G01R 31/26

OTHER PUBLICATIONS

Translation of DE-102014201781-A1 (Year: 2015).*
Translation of JP-2017166824-A (Year: 2017).*
Translation of RU-2698512-C1 (Year: 2019).*
Translation of CN-109164370-B (Year: 2020).*
Translation of CN-118688246-A (Year: 2024).*

* cited by examiner

METHOD AND DEVICE FOR MONITORING THERMAL IMPEDANCE

CROSS REFERENCE TO RELATED APPLICATION

This application claims priority to German Patent Application No. 102022122829.0 filed on Sep. 8, 2022, the content of which is incorporated by reference herein in its entirety.

TECHNICAL FIELD

The present application relates to methods for monitoring a thermal impedance of a thermal path from a semiconductor device to a heat sink or portion thereof, and to corresponding devices.

BACKGROUND

In operation, semiconductor devices dissipate power, leading to a heating of the semiconductor device. Depending on the type of semiconductor device and application, cooling is required to prevent overheating. A common approach is to thermally couple the semiconductor device to a heat sink, for example a metal block, to where the heat from the semiconductor device is transferred.

The thermal path from the semiconductor device to the heat sink may include various components like solder, plates, chip casings, metal or ceramic components and the like. Degradation of such components, or degradation of the thermal coupling between the components, may lead to a degradation of the overall thermal coupling between the semiconductor device and the heat sink and therefore to undesired heating of the semiconductor device.

While, for example, temperature sensors are used in some cases to monitor the temperature of the semiconductor device and take measures up to switching off the device in case of overheating, it may be desirable to detect the degradation of the thermal path in an early stage, such that for example the thermal path may be repaired or the device may be replaced before a shutdown of any semiconductor devices becomes necessary.

SUMMARY

A method as defined in claim 1 and a device as claimed in claim 18 are provided. The dependent claims define further implementations.

According to an implementation, a method of monitoring a thermal impedance of at least a portion of a thermal path between a semiconductor device having at least two output terminals and a heat sink is provided, the method including:

causing power dissipation in the semiconductor device by reloading parasitic capacitances of the semiconductor device such that the at least two output terminals are at the same voltage level, measuring a first temperature in response to the power dissipation at a first end of the portion of the thermal path, measuring a second temperature in response to the power dissipation at a second end of the portion of the thermal path, and determining a measure of the thermal impedance based on the first temperature and the second temperature.

In another implementation, a device is provided, including:

a semiconductor device having at least two output terminals, a heat sink, a thermal path thermally coupling the semiconductor device to the heat sink, and a test controller configured to:

cause power dissipation in the semiconductor device by reloading parasitic capacitances of the semiconductor device such that the at least two output terminals of the semiconductor device are at the same voltage level, receive a first measured temperature in response to the power dissipation at a first end of the portion of the thermal path, receive a second measured temperature in response to the power dissipation at a second end of the portion of the thermal path, and determine a measure of the thermal impedance based on the first temperature and the second temperature.

The above summary is merely a brief overview over some implementations and is not to be construed as limiting in any way.

DETAILED DESCRIPTION

In the following, various implementations will be described in detail referring to the attached drawings. These implementations are given by way of example only and are not to be construed as limiting.

While implementations may be described including a plurality of features (elements, components, acts, events, steps and the like), in other implementations some of these features may be omitted, or may be replaced by alternative features or elements. In addition to the features explicitly shown and described, further features may be provided, for example features of conventional devices related to semiconductors. For instance, implementations discussed herein focus on the analysis of a thermal path between a semiconductor device and a heat sink, and apart from this analysis, semiconductor devices, connections there between, packaging etc. may be performed or be implemented in any conventional manner.

Features from different implementations may be combined with each other to form further implementations. Variations and modifications described with respect to one of the implementations may also be applied to other implementations and will, therefore, not be described repeatedly.

Connections or couplings discussed herein may be thermal connections or couplings or may be electrical connections or couplings. Unless explicitly referred to as thermal connection, coupling or thermal path, the term connection or coupling relates to electrical connections or couplings. Such electrical connections or couplings may be modified, for example by adding additional elements, as long as the general purpose of the connection or coupling is maintained.

Figure 1:
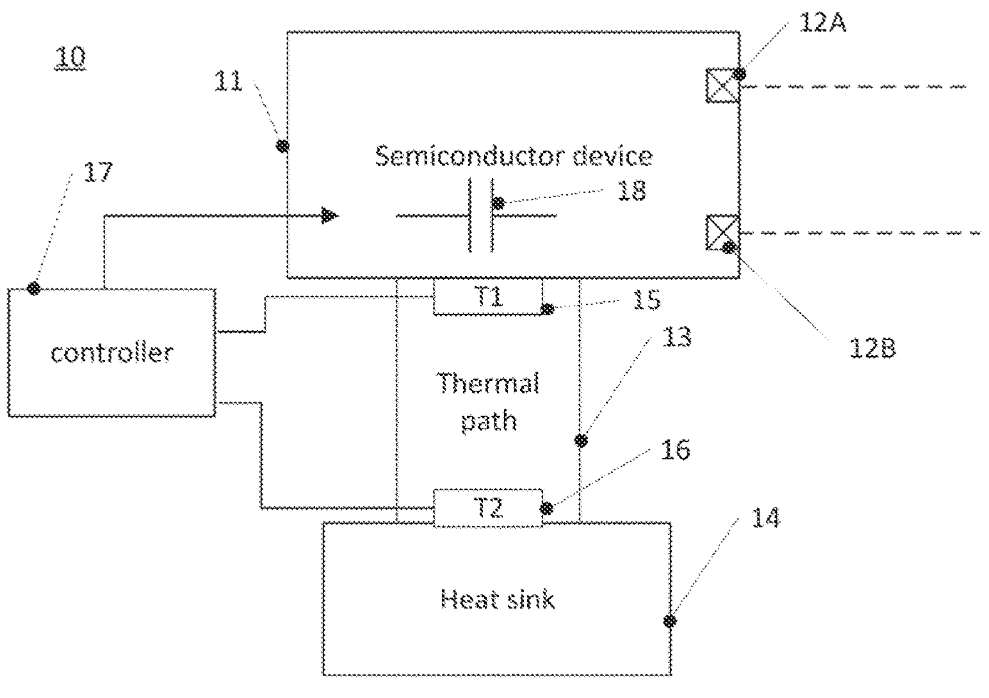
FIG. 1 is a block diagram of a device according to an implementation.

Turning now to the drawings, FIG. 1 is a block diagram illustrating a device 10 according to an implementation.

Device 10 of FIG. 1 includes a semiconductor device 11. Semiconductor device 11 may be or include any variety of one or more semiconductor devices, namely may include one or more transistors, diodes, etc., including such semiconductor devices integrated with other components like resistors. In particular implementations, semiconductor device 11 includes two or more pairs of transistors coupled as half-bridges, to selectively couple an output either to a positive input voltage or a negative input voltage. Examples for such configurations will be explained later referring to FIGS. 5 to 7. Semiconductor device 11 may be provided on one or more chip dies, for example silicon chip dies. In case of several chip dies, these may be mounted in a common package. In some implementations, in a circuit also several packages, each with one or more chip dies, may be provided. In this case, monitoring of a thermal path as described herein may be performed for one, some or all of the packages. For example, different half-bridges or different transistors of half-bridges may be provided in separate packages, with separate thermal path monitoring.

Semiconductor device 11 has a plurality of output terminals, in the example of FIG. 1 two output terminals 12A, 12B. Via output terminals 12A, 12B, semiconductor device 11 may transmit voltages, currents, signals etc. to one or more further devices. For example, in one implementation semiconductor device 11 may include transistors in half-bridge configurations to drive an electric motor or other appliance via output terminals 12A, 12B. The term output terminal, as used herein, includes any terminal or node where semiconductor device 11 can output voltages, currents, signals etc., including terminals that serve both as input and output terminals.

In operation, semiconductor device 11 dissipates power, leading to a heating of semiconductor device 11. For cooling, semiconductor device 11 is coupled to a heat sink 14 via a thermal path 13. Heat sink 14 may be any conventionally employed heat sink, for example a metal block. Thermal path 13 may include any conventional materials, layers and the like known to the skilled person for thermally coupling semiconductor device 11 to heat sink 14. For example, the thermal path may include a chip die the semiconductor device is implemented in, chip solder, a sinter layer, direct bonded copper (DBC), copper layers, DBC ceramic layers, system solder, a base plate, adhesives or the like.

Thermal path 13 may degrade over time. For example, thermal couplings between the components of thermal path 13 mentioned above may degrade, solder or adhesive used in the thermal path may degrade, etc. Such a degradation causes an increased thermal impedance of thermal path 13, such that the possible amount of heat dissipated from semiconductor device 11 to heat sink 14 decreases, for the same temperature of the semiconductor device and the heat sink, for the same temperature difference. In practice, this may lead to overheating of the semiconductor device 11, which in turn may either damage semiconductor device 11 or cause for example an emergency shutdown of semiconductor device 11, which may be undesirable. In the following, techniques according to various implementations will be discussed to monitor the thermal impedance over time, in order to detect a degradation of thermal path 13 early. Then, for example device 10 may be exchanged, before overheating all other issues occur.

In particular, techniques described in the following enable a measuring and monitoring of the thermal impedance of at least a portion of thermal path 13. "At least a portion" means that either the thermal impedance of the complete thermal path 13 may be monitored, or, in other implementations, only of a portion of thermal path 13, for example a portion which from previous experience with similar devices is known to be particularly prone to degradation.

For ease of explanations, in the following examples it is assumed that the thermal impedance of the complete thermal path 13 is measured. However, the explanations also apply for measuring only a thermal impedance of a portion of thermal path 13.

Generally, to determine the thermal impedance a defined power dissipation corresponding to a defined heat source is applied at one end of the thermal path, and the temperature difference between the two ends of the thermal path is measured.

For measuring the temperature difference, device 10 includes a first temperature sensor 15 to measure a first temperature T1 at a first end of thermal path 13 (the end at semiconductor device 11) and a second temperature sensor 16 for measuring a temperature T2 at a second end of thermal path 13 adjacent to heat sink 14. The temperatures T1, T2 are provided to a test controller 17 which controls the measuring and monitoring of the thermal impedance of thermal path 13. In case only the impedance of a portion of thermal path 13 is to be monitored, temperature sensors 15, 16 correspondingly are placed at the end of this portion. Also, more than two temperature sensors may be provided, to monitor the thermal impedance of multiple portions of thermal path 13 simultaneously. Test controller may be any suitable control device and may e.g., include a microcontroller or an application specific integrated circuit. Test controller 17 may be a dedicated test controller, or a controller also used for other purposes, for example to control device 10 during normal operation.

Any conventional temperature sensors may be used as temperature sensors 15, 16. For example, for measuring the temperature at semiconductor device 11, temperature sensor 15 may include series connected diodes for providing a junction temperature measurement. Other conventional temperature sensors may be used as well. As a second temperature sensor 16, for example at a base plate at the end of the thermal path, for example a NTC (negative temperature coefficient) thermistor may be used.

In this way, the temperature difference across the thermal path ΔT may be determined as ΔT=T1−T2.

For providing a controlled power dissipation, one or more parasitic capacitances of semiconductor device 11 are used.

Generally, a parasitic capacitance is a capacitance which is not implemented as a dedicated capacitor, but which is present inherent to the design of the semiconductor device. Such parasitic capacitances exist in most, if not all, semiconductor devices designs, for example as capacitances between terminals of the device, capacitances between the device and a substrate, etc. The parasitic capacitances, and the capacitance values thereof, are fixed by the design and there of the semiconductor device and therefore essentially is a fixed quantity. In FIG. 1, such one or more parasitic capacitances of semiconductor device 11 are represented by a parasitic capacitance 18.

To generate a defined power dissipation for determining the thermal impedance of thermal path 13, in implementations parasitic capacitance 18 is reloaded, in particular reloaded repeatedly, controlled by test controller 17. For example, if parasitic capacitance 18 is a parasitic capacitance of a transistor switch, a transistor switch may be switched on and off repeatedly while a DC voltage is applied to the transistor switch (such a DC voltage is needed for the charging of the capacitances) for reloading parasitic capacitance 18. The reloading is performed such that a same voltage is present at output terminals 12A, 12B, with the consequence that no current flows between output terminals 12A, 12B and through loads coupled to the semiconductor device 11. For example, to achieve this, transistors coupled to output terminals 12A, 12B may be switched in a symmetric manner for the reloading of capacitance 18, such that the voltage remains the same at terminals 12A, 12B.

The number of repetitions of the switching on and off may be fixed or predetermined for each measurement. For example, for every measurement cycle for measuring the thermal impedance the switching on and off maybe carried out n times, wherein n may be any number greater than 1. By keeping the number and the frequency of repetitions constant, it can be ensured that the power dissipated is the same for every measurement. The more repetitions of the switching are carried out, the greater the dissipated power within semiconductor device 11. This may result in an increased signal to noise ratio of the measurement. On the other hand, too many repetitions of the switching may lead to a lengthy measurement procedure affecting the quality of the measurement due to thermal relaxation processes.

Parasitic capacitances of semiconductor devices are essentially independent from temperature and aging. Therefore, the power dissipation caused by this way only depends from the structure of semiconductor device 11 itself and the parasitic capacitance 18 caused thereby, the frequency of the reloading controlled by controller 17 and the voltage applied. Therefore, in this way a defined power dissipation can be obtained. Advantageously, in some implementations the defined power dissipation may remain constant over time, e.g., years or decades, as the parasitic capacitances may be prone to aging not all or only to a negligible amount. In particular, for each measurement performed, the same power dissipation may be ensured. Based on the power dissipation and the temperature difference ΔT, a measure for the thermal impedance may be calculated. "Measure of the thermal impedance" means that the quantity, e.g., the measure, resulting indicates the thermal impedance and in particular variations thereof.

In some implementations, when the parasitic capacitance 18 may be quantitatively determined, for example based on the design, then also an absolute value of the power dissipation is known. In this way, the power dissipation and the thermal impedance may be determined quantitatively.

In other implementations, it is sufficient to ensure that either always the same frequency and voltage is applied for reloading parasitic capacitance 18, or, in case the voltage changes, a corresponding correlation between voltage and power dissipation is determined by calibration in advance, and the result is then compensated accordingly. In this case, for example only the temperature difference may be taken as the measure, as always the same power dissipation occurs (or is compensated). In case the temperature difference changes over time when the measurement is performed repeatedly (for example every day, every week, every month etc.), this may indicate a deterioration of the thermal path. In other words, the measurement need not be a quantitative measure of the thermal impedance, but in many applications it is sufficient if changes in the thermal impedance of the thermal path are reflected by the measure.

Figure 2:
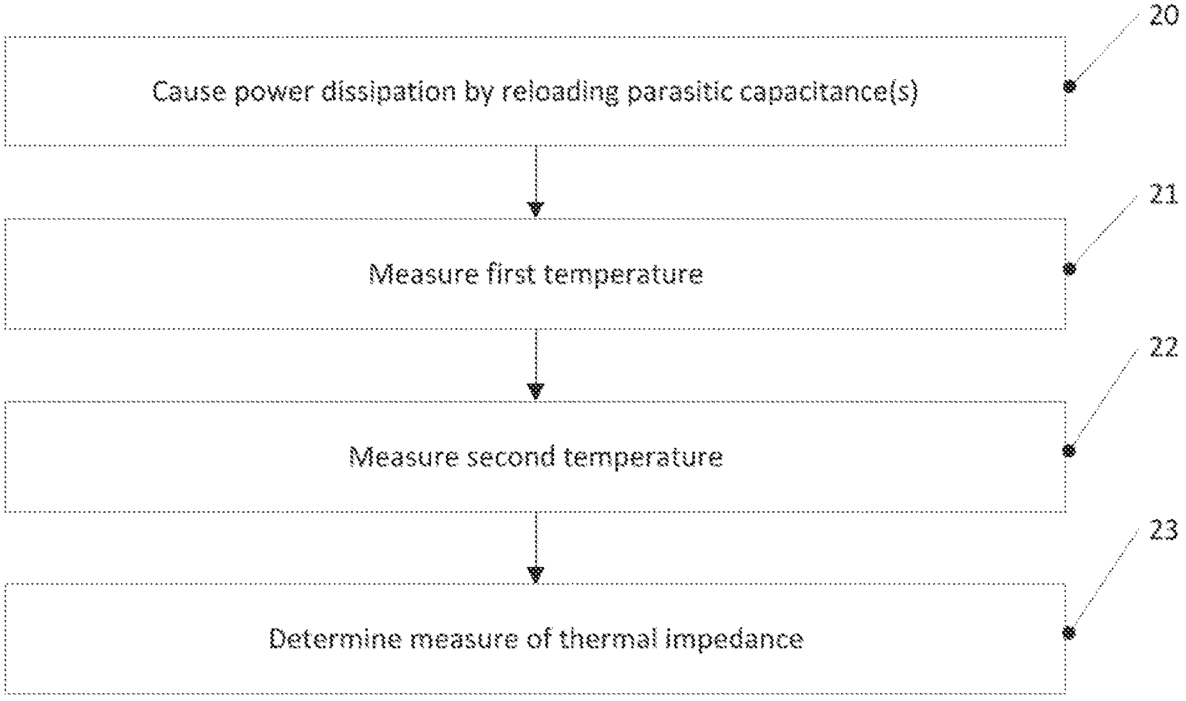
FIG. 2 is a flowchart illustrating a method according to an implementation.

FIG. 2 is a flowchart illustrating a method according to an implementation. The method of FIG. 2 may be implemented in the device of FIG. 1 or any of the devices discussed further below, but is not limited thereto. To avoid repetitions, when explaining FIG. 2 reference will be made to the above explanations for FIG. 1.

At 20, the method of FIG. 2 comprises causing power dissipation in a semiconductor device by reloading one or more parasitic capacitances, as explained above for parasitic capacitance 18. This is done in a manner that a voltage at at least two output terminals of the semiconductor device, for example output terminals 12A, 12B of FIG. 1, is at the same level.

At 21, the method comprises measuring a first temperature at a first end of a portion of a thermal path to be evaluated, and at 22 the method comprises measuring a second temperature at a second end of the portion, for example temperatures T1 and T2 of FIG. 1.

At 23, the method comprises determining a measure of the thermal impedance, as also explained with respect to FIG. 1 above, e.g., as the temperature difference between the first temperature and the second temperature established in response to the power dissipation, for example in an essentially stationary state, or—in case the power dissipation is quantitatively known—as a ratio between the difference between the first temperature and the second temperature, and the dissipated power.

Figure 3:
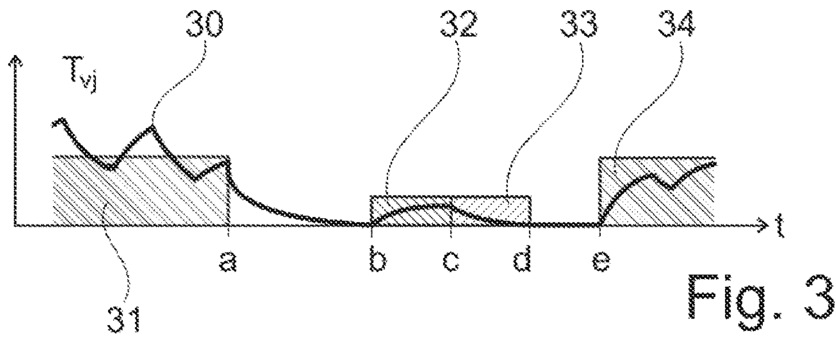
FIG. 3 is a timing diagram for illustrating some implementations.

In implementations, the impedance measurement of the thermal path or portion thereof is performed in periods where the semiconductor device 11 is not actively used. Furthermore, the generation of the power dissipation by reloading the parasitic capacitance in implementations is long enough such that an essentially stationary state is reached. FIG. 3 illustrates a corresponding timing diagram. A curve 30 shows the junction temperature $T_{vj}$ of a semiconductor device over time, which in the example of FIG. 3 may be a power inverter used for controlling a motor like a three-phase motor.

In a time period 31 up to a time a, the semiconductor device is operated normally according to the purpose of the semiconductor device, which leads to a certain temperature behaviour. Following this, between times a and b, a cooling down period follows, during which the semiconductor device is for example cooled to at or near ambient temperature before the measuring of the impedance of the thermal path. For example, the time duration between time a and time b may be at least three times, for example between three times and five times a thermal constant T of the thermal path or more, for example 5 second or more or 10 seconds or more. More generally, is may be determined if semiconductor device 11 is at least to a certain extent in thermal equilibrium. For example, it may be determined if semiconductor device 11 meets a predetermined equilibrium criterion. The predetermined equilibrium criterion may comprise on or more of the following: a gradient of T1 over time is smaller than a first predetermined value, a gradient of T2 over time is smaller than a second predetermined value, a temperature difference between T1 and the ambient temperature is smaller than a third predetermined value, a temperature difference between T2 and the ambient temperature is smaller than a fourth predetermined value, or the time duration between time a and time b exceeds a predetermined time duration. The above first through fourth predetermined values and the predetermined time duration may for example be determined based on calibration measurements, and may ensure that the time until the equilibrium criterion is met exceeds the thermal constant r, for example is between three times and five times T as mentioned already above for the time duration.

Following this, in a heating phase 32 between time b and time c a heating based on the reloading of parasitic capacitances as discussed above follows. The time duration is long enough to essentially ensure a stationary behavior, for example again three r, five T or more, for example at least five seconds or at least 10 seconds. Then, following phase 32 at the time c a measurement of the temperatures is performed, followed by a cooling in phase 33 up to a time d. From a time d onwards, then normal operation may again be resumed, which in the example of FIG. 3 happens at a time e in a phase 34. The measurement of the temperatures at time c is used to calculate the measure of the thermal impedance. In some implementations, the temporal behavior of the temperatures throughout phase 33 or part thereof may additionally be monitored, and the thermal impedance may be calculated based on the temporal behavior.

The measurement may be performed at a plurality of times during the lifetime of device 10, as mentioned above, for example daily, monthly, yearly or in time intervals depending on the use of a device, for example after a predefined operation time. A reference measurement may be made at the beginning of the lifetime of device 10, and following measurements may be compared to this reference measurement, and a deviation by more than a predefined amount or a predefined ratio may indicate a deterioration of the thermal path which requires the device 10 to be repaired or replaced. Preferably, the measurement is performed at times where no normal operation occurs anyway, for example at night when the semiconductor device is only used for during daytime, at service downtimes or during standstill of a vehicle, etc.

Figure 4:
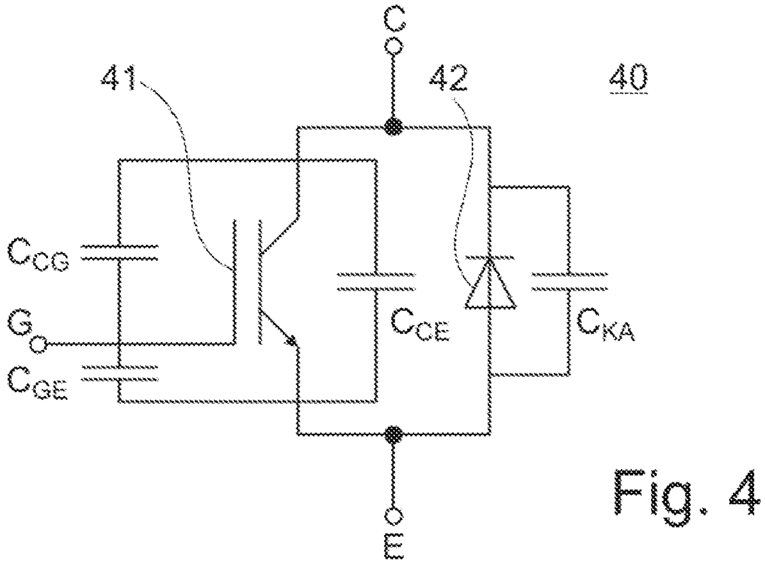
FIG. 4 is a diagram for illustrating parasitic capacitances of a transistor useable in some implementations.

Next, specific examples of semiconductor devices to which the techniques discussed above may be applied will be discussed. The semiconductor devices discussed in the following use transistor switches and parasitic capacitances thereof. FIG. 4 shows an example circuit diagram of an insulated gate bipolar transistor (IGBT) 40 usable in some implementations. In other implementations, other types of transistors like field-effect transistors (FETs) like MOSFETs or JFETs, high electron mobility transistors (HEMTs) may be used as switches, which have similar parasitic capacitances. Such transistors may be based on different semiconductor materials like group IV materials such as silicon (Si) or silicon carbide (SiC), or group III-V compounds such as gallium nitride (GaN). Therefore, the detailed description below using IGBT 40 as example for the transistor switch applies to other types of transistors analogously, or also to semiconductor switches including several transistors (for example as transistor cells), like stacked transistor cells for high voltage applications or parallel transistor cells for high current applications.

IGBT 40 of FIG. 4 includes an ideal IGBT 41 with a gate terminal G, a collector terminal C and an emitter terminal E. "Ideal" means that parasitic components, in particular parasitic capacitances, are shown separately in FIG. 4, such that ideal IGBT 41 only represents the "IGBT function" itself. Additionally, as often the case in IGBT based switches, a diode 42 is provided as shown. Parasitic capacitances include a collector gate capacitance $C_{CG}$, a gate emitter capacitance $C_{GE}$, a collector emitter capacitance $C_{CE}$ and a capacitance $C_{KA}$ provided by diode 42. When IGBT 40 is switched on and off repeatedly with an applied DC voltage, the parasitic capacitances are reloaded, e.g., charged and discharged, leading to power dissipation, which is used in implementations.

Figure 5:
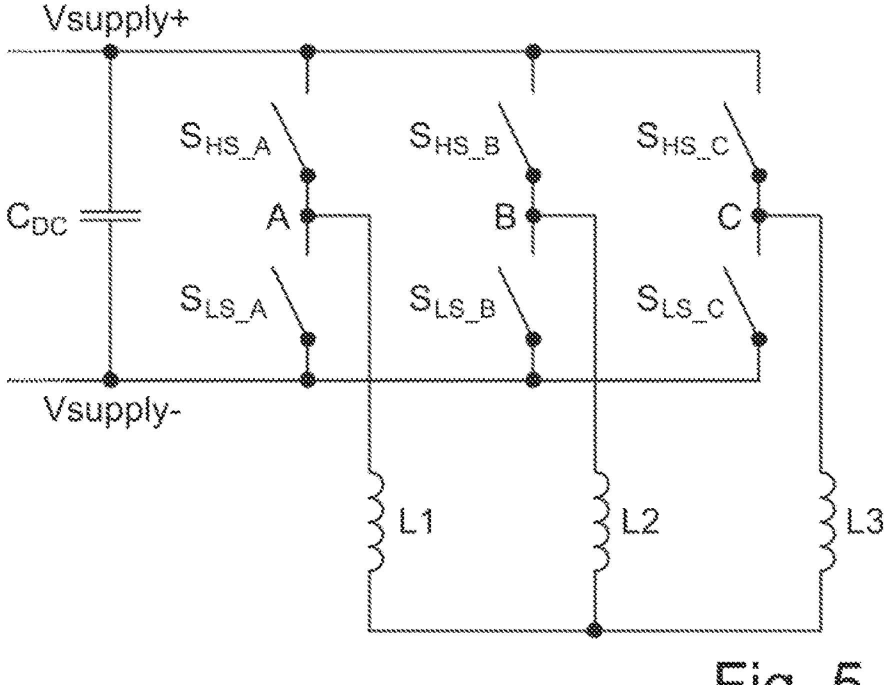
FIG. 5 is a circuit diagram illustrating an implementation.

FIG. 5 illustrates a semiconductor device together with a connected load, which may serve as semiconductor device 11 of FIG. 5. The semiconductor device of FIG. 5 includes six switches arranged in three half-bridges, which may serve as a three-phase inverter. In other implementations, for example two-phase inverters may be used. A first half-bridge includes a high-side switch $S_{HS\_A}$ and a low-side switch $S_{LS\_A}$ with an output node A, a second half-bridge includes switches $S_{HS\_B}$ and low-side switch $S_{LS\_B}$ with an output node B, and a third half-bridge includes a high-side switch $S_{HS\_C}$ and a low-side switch $S_{LS\_C}$ with an output node C. These switches may be IGBTs as shown in FIG. 4, MOSFET switches or other kinds of transistor switches. In operation, they are coupled between a positive supply voltage Vsupply+ and a negative supply voltage Vsupply−, such that overall a supply voltage (Vsupply+−Vsupply−) is used. Output nodes A, B and C are examples for output terminals like output terminals 12A, 12B of FIG. 1 of the semiconductor device. As a load, in the example of FIG. 5 an inductive load including inductors L1, L2, L3 is shown, which may for example be windings of a three-phase motor. A capacitance between the rails for power supply and ground is labeled $C_{DC}$ in FIG. 5.

For reloading the parasitic capacitances while keeping the output nodes A, B and C at the same voltage level, alternatingly all high-side switches $S_{HS\_A}$, $S_{HS\_B}$ and $S_{HS\_C}$ are closed while the low-side switches $S_{LS\_A}$, $S_{LS\_B}$, $S_{LS\_C}$ are open, followed by the reverse case where the high-side switches are open and the low-side switches are closed. Usually, dead times where all switches are open are inserted in between, where all switches are open, to prevent an accidental short circuit between Vsupply+ and Vsupply−.

As the voltages at nodes A, B and C are always the same this way, no current flows via inductors L1, L2, L3. In terms of a three-phase vector control, this corresponds to a zero vector.

If the measurement is always performed with the same supply voltage power supply, the measurements are immediately comparable, provided that the duration of the reloading and the frequency thereof are the same. The frequency may for example be in a range of 2 to 8 times a switching frequency the device is used at in normal operation. As mentioned above, in case the supply voltage Vsupply+, Vsupply− varies, a corresponding calibration may be performed, and the results of the impedance measurement may be adapted accordingly.

Figure 6:
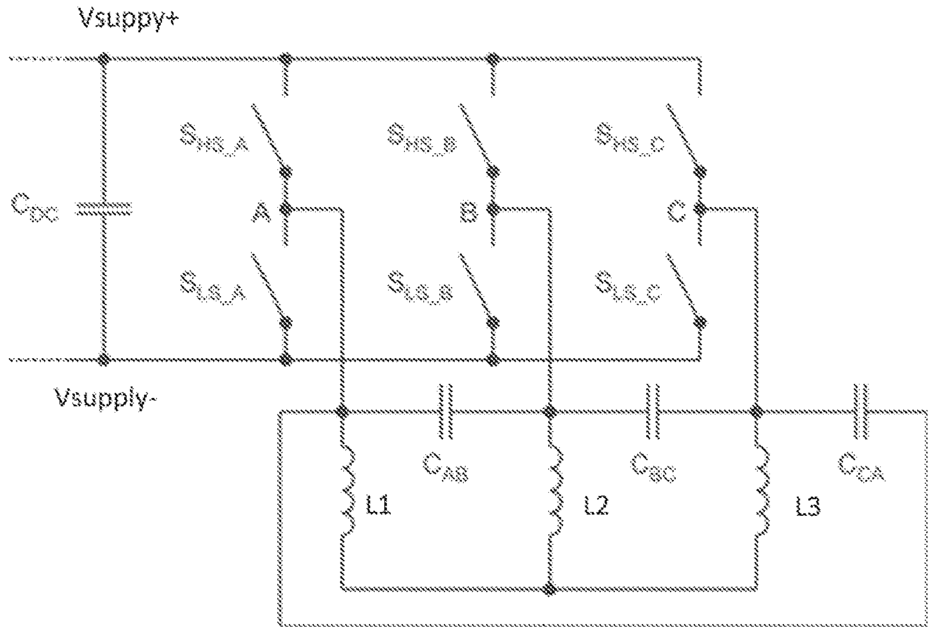
FIG. 6 is a circuit diagram illustrating an implementation.
Figure 7:
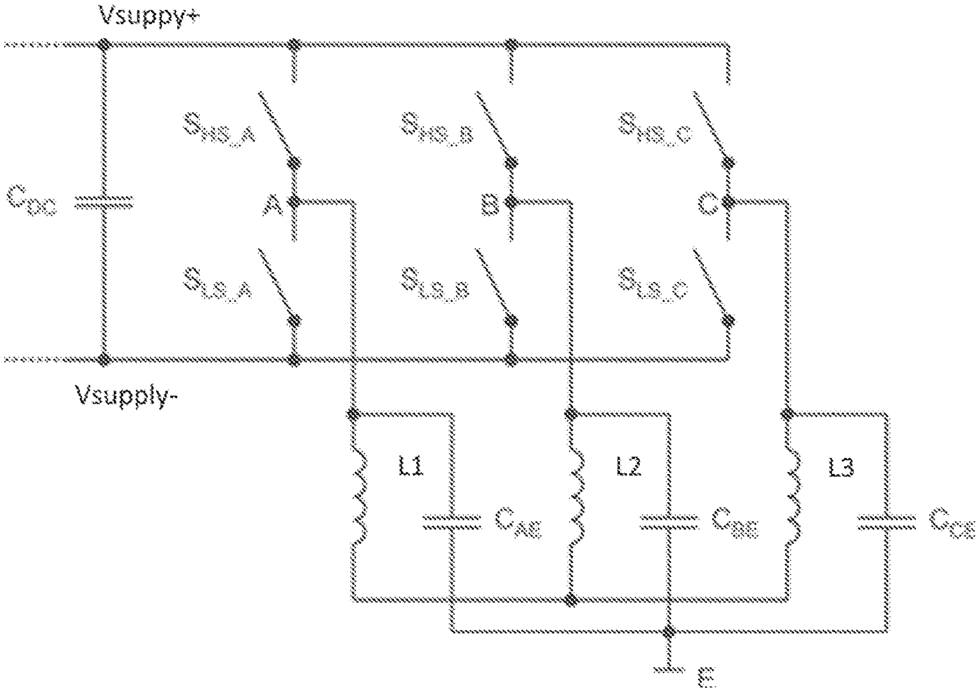
FIG. 7 is a circuit diagram illustrating an implementation.

Coupling of the load may lead to additional capacitances. These are shown in FIGS. 6 and 7. Apart from the additional capacitances described in the following, FIGS. 6 and 7 correspond to FIG. 5, and the corresponding parts will not be described again.

FIG. 6 shows capacitances $C_{AB}$, $C_{BC}$ and $C_{CA}$ coupled between the conductors (inductors), resulting in parasitic capacitances between nodes A, B, C. As with the approach discussed herein, the voltage at A, B and C are maintained at the same level, the voltage difference across these capacitances is zero, such that they are not reloaded in the approach discussed herein and can be neglected.

FIG. 7 shows additional capacitances (e.g., a plurality of capacitances) coupled to ground E, namely capacitances (e.g., capacitors) $C_{AE}$, $C_{BE}$ and $C_{CE}$. Ground E is usually at half the supply voltage power supply. These capacitances are also reloaded when performing the method as discussed above. However, when Ground E is at halfway between the supply voltages Vsupply+, Vsupply−, e.g., is Vuspply−+(Vsupply+−Vsupply−)/2, these capacitances have a symmetrical behavior with respect to the high-side switches and low-side switches of the semiconductor device. Moreover, the capacitances $C_{AE}$, $C_{BE}$ and $C_{CE}$ are usually equal for all three phases, and constant with respect to temperature, as they are given by the geometry of the load. Therefore, these capacitances at best cause a symmetric and temperature independent power dissipation, which is the same for each application of the method and therefore does not influence the comparability of the results between measurements. However, it should be noted that while an asymmetric case would lead to an asymmetric loss distribution in the half-bridge (e.g., to low-side switch heating more than high-side switch), comparability between measurements would still be ensured, such that a qualitative monitoring may still be performed. An absolute measure of the thermal impedance taking these capacitances into account is possible if these capacitances are known, including the voltage dependence (parasitic capacitances of the semiconductor devices may be voltage dependent), an absolute measure of the thermal impedance is possible. However, at least for monitoring purposes it is usually sufficient if the results are comparable, e.g., a degradation of the thermal path can be detected.

Aspects

Some implementations are defined by the following aspects:

Aspect 1. A method of monitoring a thermal impedance of at least a portion of a thermal path between a semiconductor device having at least two output terminals and a heat sink, comprising:
- causing power dissipation in the semiconductor device by reloading parasitic capacitances of the semiconductor device such that the at least two output terminals are at the same voltage level,
- measuring a first temperature in response to the power dissipation at a first end of the portion of the thermal path,
- measuring a second temperature in response to the power dissipation at a second end of the portion of the thermal path, and
- determining a measure of the thermal impedance based on the first temperature and the second temperature.

Aspect 2. The method of aspect 1, wherein determining the measure comprises determining a ratio between the power dissipated and a difference between the first temperature and the second temperature.

Aspect 3. The method of aspects 1 or 2, wherein reloading parasitic capacitances comprises repeatedly switching on and off one or more transistors of the semiconductor device.

Aspect 4. The method of aspect 3, wherein the one or more transistors comprise a respective half-bridge including a high-side transistor and a low-side transistor for each of the at least two output terminals, each output terminal coupled to a node between a respective high-side transistor and a respective low-side transistor, wherein repeatedly switching on and off at least one transistor of the semiconductor device comprises repeatedly:
- switching the low-side side transistors of all half-bridges off and the high-side transistors of all half-bridges on, and
- switching the high-side transistors of all half-bridges off and the low-side transistors of all half-bridges on.

Aspect 5. The method of any one of aspects 1 to 4, wherein the causing power dissipation, measuring the first temperature, measuring the second temperature and determining the measure is performed repeatedly over time, wherein the method further comprises detecting a degradation of the portion of the thermal path by evaluating the measure over time.

Aspect 6. The method of aspect 5, wherein the performing repeatedly comprises performing repeatedly over a lifetime of the semiconductor device.

Aspect 7. The method of any one of aspects 1 to 6, wherein the first end is at the semiconductor device, and the second end is at the heat sink.

Aspect 8. The method of any one of aspects 1 to 7, wherein the at least a portion of the thermal path includes the whole thermal path.

Aspect 9. The method of any one of aspects 1 to 8, further comprising adjusting the measure based on a voltage on which the reloading is based.

Aspect 10. The method of any one of aspects 1 to 9, wherein the method is executed while the at least two output terminals are coupled to a load.

Aspect 11. The method of aspect 10, wherein the measure is further determined based on capacitances to ground caused by the presence of the load.

Aspect 12. The method of any one of aspects 1 to 11, wherein the semiconductor device comprises a three-phase inverter, and the at least two output terminals comprise three output terminals of the three-phase inverter.

Aspect 13. The method of any one of aspects 1 to 12, wherein the causing of the power dissipation is performed only when a predefined equilibrium criterion is met.

Aspect 14. The method of aspect 13, wherein the predefined equilibrium criterion comprises at least one of the group consisting of:
- the semiconductor device having been inactive for at least a predefined first time duration;
- the semiconductor device having been inactive for a time duration of at least three times a thermal time constant of the thermal path;
- a gradient of the first temperature over time being smaller than a first predetermined value;
- a gradient of the second temperature over time being smaller than a second predetermined value;
- a temperature difference between the first temperature and the ambient temperature being smaller than a third predetermined value; and
- a temperature difference between the second temperature and the ambient temperature being smaller than a fourth predetermined value.

Aspect 15. The method of any one of aspects 1 to 14, wherein the causing of the power dissipation is performed for a predefined second time duration.

Aspect 16. The method of aspect 15, wherein the predefined second time duration is at least three times a thermal time constant of the thermal path.

Aspect 17. The method of any one of aspects 1 to 16, wherein the thermal path comprises one or more elements selected from the group consisting of a chip die the semiconductor device is implemented in, chip solder, a sinter layer, direct bonded copper, DBC, copper layers, DBC ceramic layers, system solder, a base plate, and an adhesive.

Aspect 18. A device, comprising:
- a semiconductor device having at least two output terminals,
- a heat sink,
- a thermal path thermally coupling the semiconductor device to the heat sink, and
- a test controller configured to:

cause power dissipation in the semiconductor device by reloading parasitic capacitances of the semiconductor device such that the at least two output terminals of the semiconductor device are at the same voltage level, receive a first measured temperature in response to the power dissipation at a first end of the portion of the thermal path, receive a second measured temperature in response to the power dissipation at a second end of the portion of the thermal path, and determine a measure of the thermal impedance based on the first temperature and the second temperature.

Aspect 19. The device of aspect 18, wherein the device is configured to implement the method of any one of aspects 1 to 17.

Aspect 20. The device of aspects 18 or 19, wherein to determine the measure the test controller is configured to determine a ratio between the power dissipated and a difference between the first temperature and the second temperature.

Aspect 21. The device of any one of aspects 18 to 20, wherein for reloading parasitic capacitances the test controller is configured to repeatedly cause switching on and off one or more transistors of the semiconductor device.

Aspect 22. The device of aspect 21, wherein the one or more transistors comprise a respective half-bridge including a high-side transistor and a low-side transistor for each of the at least two output terminals, each output terminal coupled to a node between a respective high-side transistor and a respective low-side transistor, wherein for repeatedly switching on and off at least one transistor of the semiconductor device the test controller is configured to cause repeatedly:

switching the low-side side transistors of all half-bridges off and the high-side transistors of all half-bridges on, and switching the high-side transistors of all half-bridges off and the low-side transistors of all half-bridges on.

Aspect 23. The device of any one of aspects 18 to 22, wherein the test controller is configured to perform the causing power dissipation, receiving the first measured temperature, receiving the second measured temperature and determining the measure repeatedly over time, wherein the test controller is further configured to detect a degradation of the portion of the thermal path by evaluating the measure over time.

Aspect 24. The device of aspect 23, wherein the performing repeatedly comprises performing repeatedly over a lifetime of the semiconductor device.

Aspect 25. The device of any one of aspects 18 to 24, wherein the first end is at the semiconductor device, and the second end is at the heat sink.

Aspect 26. The device of any one of aspects 18 to 25, wherein the at least a portion of the thermal path includes the whole thermal path.

Aspect 27. The device of any one of aspects 18 to 26, wherein the test controller is configured to adjust the measure based on a voltage on which the reloading is based.

Aspect 28. The device of any one of aspects 18 to 27, wherein the at least two output terminals are coupled to a load.

Aspect 29. The device of aspect 28, wherein the test controller is configured to further determine the measure based on capacitances to ground caused by the presence of the load.

Aspect 30. The device of any one of aspects 18 to 29, wherein the semiconductor device comprises a three-phase inverter, and the at least two output terminals comprise three output terminals of the three-phase inverter.

Aspect 31. The device of any one of aspects 18 to 30, wherein the test controller is configured to cause the power dissipation after the semiconductor device was inactive for at least a predefined first time duration.

Aspect 32. The device of aspect 31, wherein the predefined first time duration is at least three times a thermal time constant of the thermal path.

Aspect 33. The device of any one of aspects 18 to 32, wherein the test controller is configured to cause the power dissipation for a predefined second time duration.

Aspect 34. The device of aspect 33, wherein the predefined second time duration is at least three times a thermal time constant of the thermal path.

Aspect 35. The device of any one of aspects 18 to 34, wherein the thermal path comprises one or more elements selected from the group consisting of a chip die the semiconductor device is implemented in, chip solder, a sinter layer, direct bonded copper, DBC, copper layers, DBC ceramic layers, system solder, a base plate, and an adhesive.

Aspect 36. A method of monitoring a thermal impedance of a portion of a thermal path between a semiconductor device, having at least two output terminals, and a heat sink, the method comprising: causing a power dissipation in the semiconductor device by reloading parasitic capacitances of the semiconductor device such that the at least two output terminals are at a same voltage level; measuring a first temperature in response to the power dissipation at a first end of the portion of the thermal path; measuring a second temperature in response to the power dissipation at a second end of the portion of the thermal path; and determining a measure of the thermal impedance based on the first temperature and the second temperature.

Aspect 37. The method of Aspect 36, wherein determining the measure of the thermal impedance comprises determining a ratio between a power dissipated corresponding to the power dissipation and a difference between the first temperature and the second temperature.

Aspect 38. The method of any of Aspects 36-37, wherein reloading the parasitic capacitances comprises repeatedly switching on and off one or more transistors of the semiconductor device.

Aspect 39. The method of Aspect 38, wherein the semiconductor device comprises a plurality of half-bridges and the one or more transistors includes a plurality of transistors, including a plurality of low-side transistors and a plurality of high-side transistors, that form the plurality of half-bridges, wherein each half-bridge includes a respective high-side transistor and a respective low-side transistor for each of the at least two output terminals, wherein each half-bridge includes a respective output terminal coupled to a respective node between the respective high-side transistor and the respective low-side transistor, and wherein repeatedly switching on and off the plurality of transistors of the semiconductor device comprises repeatedly: switching the plurality of low-side transistors of the plurality of half-bridges off and switching the plurality of high-side transistors of the plurality of half-bridges on, and switching the plurality of high-side transistors of the plurality of half-bridges off and switching the plurality of low-side transistors of the plurality of half-bridges on.

Aspect 40. The method of any of Aspects 36-39, wherein causing the power dissipation, measuring the first temperature, measuring the second temperature, and determining the measure of the thermal impedance is performed repeatedly over time, and wherein the method further comprises detecting a degradation of the portion of the thermal path by evaluating the measure of the thermal impedance over time.

Aspect 41. The method of Aspect 40, wherein causing the power dissipation, measuring the first temperature, measuring the second temperature, and determining the measure of the thermal impedance is performed repeatedly over a lifetime of the semiconductor device.

Aspect 42. The method of any of Aspects 36-41, wherein the first end is at the semiconductor device, and the second end is at the heat sink.

Aspect 43. The method of any of Aspects 36-42, wherein the portion of the thermal path includes a whole portion of the thermal path.

Aspect 44. The method of any of Aspects 36-43, further comprising: adjusting the measure of the thermal impedance based on a voltage on which the reloading of the parasitic capacitances is based.

Aspect 45. The method of any of Aspects 36-44, wherein the method is executed while the at least two output terminals are coupled to a load.

Aspect 46. The method of Aspect 45, wherein the measure of the thermal impedance is further determined based on a plurality of capacitances coupled to ground caused by a presence of the load.

Aspect 47. The method of any of Aspects 36-46, wherein the semiconductor device comprises a three-phase inverter, and the at least two output terminals comprise three output terminals of the three-phase inverter.

Aspect 48. The method of any of Aspects 36-47, wherein causing the power dissipation is performed only when a predefined equilibrium criterion is met.

Aspect 49. The method of Aspect 48, wherein the predefined equilibrium criterion comprises at least one of the group consisting of: the semiconductor device has been inactive for at least a predefined first time duration, the semiconductor device has been inactive for a time duration of at least three times a thermal time constant of the thermal path, a gradient of the first temperature over time is smaller than a first predetermined value, a gradient of the second temperature over time is smaller than a second predetermined value, a temperature difference between the first temperature and an ambient temperature is smaller than a third predetermined value, and a temperature difference between the second temperature and the ambient temperature is smaller than a fourth predetermined value.

Aspect 50. The method of Aspect 49, wherein causing the power dissipation is performed for a predefined second time duration.

Aspect 51. The method of Aspect 50, wherein the predefined second time duration is at least three times the thermal time constant of the thermal path.

Aspect 52. The method of any of Aspects 36-51, wherein the thermal path comprises one or more elements selected from the group consisting of a chip die that the semiconductor device is implemented in, chip solder, a sinter layer, direct bonded copper, copper layers, direct bonded copper ceramic layers, system solder, a base plate, and an adhesive.

Aspect 53. A device, comprising: a semiconductor device having at least two output terminals; a heat sink; a thermal path configured to thermally couple the semiconductor device to the heat sink; and a test controller configured to: cause a power dissipation in the semiconductor device by reloading parasitic capacitances of the semiconductor device such that the at least two output terminals of the semiconductor device are at a same voltage level, receive a first measured temperature corresponding to the power dissipation at a first end of a portion of the thermal path, receive a second measured temperature corresponding to the power dissipation at a second end of a portion of the thermal path, and determine a measure of a thermal impedance of the portion of the thermal path based on the first measured temperature and the second measured temperature.

Aspect 54. The device of Aspect 53, wherein the test controller is configured to determine of the measure of the thermal impedance by calculating a ratio between a power dissipated corresponding to the power dissipation and a difference between the first measured temperature and the second measured temperature.

Aspect 55. The device of any of Aspects 53-54, wherein the test controller is configured to reload the parasitic capacitances by repeatedly switching on and off one or more transistors of the semiconductor device.

Aspect 56. A system configured to perform one or more operations recited in one or more of Aspects 36-55.

Aspect 57. An apparatus comprising means for performing one or more operations recited in one or more of Aspects 36-55.

Although specific implementations have been illustrated and described herein, it will be appreciated by those of ordinary skill in the art that a variety of alternate and/or equivalent implementations may be substituted for the specific implementations shown and described without departing from the scope of the present implementation. This application is intended to cover any adaptations or variations of the specific implementations discussed herein. Therefore, it is intended that this implementation be limited only by the claims and the equivalents thereof.

The invention claimed is:

1. A method of monitoring a thermal impedance of a portion of a thermal path between a semiconductor device, having at least two output terminals, and a heat sink, the method comprising:

causing a power dissipation in the semiconductor device by reloading parasitic capacitances of the semiconductor device such that the at least two output terminals are at a same voltage level;

measuring a first temperature in response to the power dissipation at a first end of the portion of the thermal path;

measuring a second temperature in response to the power dissipation at a second end of the portion of the thermal path; and determining a measure of the thermal impedance based on the first temperature and the second temperature.

2. The method of claim 1, wherein determining the measure of the thermal impedance comprises determining a ratio between a power dissipated corresponding to the power dissipation and a difference between the first temperature and the second temperature.

3. The method of claim 1, wherein reloading the parasitic capacitances comprises repeatedly switching on and off one or more transistors of the semiconductor device.

4. The method of claim 3, wherein the semiconductor device comprises a plurality of half-bridges and the one or more transistors includes a plurality of transistors, including a plurality of low-side transistors and a plurality of high-side transistors, that form the plurality of half-bridges, wherein each half-bridge includes a respective high-side transistor and a respective low-side transistor for each of the at least two output terminals, wherein each half-bridge includes a respective output terminal coupled to a respective node between the respective high-side transistor and the respective low-side transistor, and wherein repeatedly switching on and off the plurality of transistors of the semiconductor device comprises repeatedly:

switching the plurality of low-side transistors of the plurality of half-bridges off and switching the plurality of high-side transistors of the plurality of half-bridges on, and switching the plurality of high-side transistors of the plurality of half-bridges off and switching the plurality of low-side transistors of the plurality of half-bridges on.

5. The method of claim 1, wherein causing the power dissipation, measuring the first temperature, measuring the second temperature, and determining the measure of the thermal impedance is performed repeatedly over time, and wherein the method further comprises detecting a degradation of the portion of the thermal path by evaluating the measure of the thermal impedance over time.

6. The method of claim 5, wherein causing the power dissipation, measuring the first temperature, measuring the second temperature, and determining the measure of the thermal impedance is performed repeatedly over a lifetime of the semiconductor device.

7. The method of claim 1, wherein the first end is at the semiconductor device, and the second end is at the heat sink.

8. The method of claim 1, wherein the portion of the thermal path includes a whole portion of the thermal path.

9. The method of claim 1, further comprising:

adjusting the measure of the thermal impedance based on a voltage on which the reloading of the parasitic capacitances is based.

10. The method of claim 1, wherein the method is executed while the at least two output terminals are coupled to a load.

11. The method of claim 10, wherein the measure of the thermal impedance is further determined based on a plurality of capacitances coupled to ground caused by a presence of the load.

12. The method of claim 1, wherein the semiconductor device comprises a three-phase inverter, and the at least two output terminals comprise three output terminals of the three-phase inverter.

13. The method of claim 1, wherein causing the power dissipation is performed only when a predefined equilibrium criterion is met.

14. The method of claim 13, wherein the predefined equilibrium criterion comprises at least one of the group consisting of:

the semiconductor device has been inactive for at least a predefined first time duration, the semiconductor device has been inactive for a time duration of at least three times a thermal time constant of the thermal path, a gradient of the first temperature over time is smaller than a first predetermined value, a gradient of the second temperature over time is smaller than a second predetermined value, a temperature difference between the first temperature and an ambient temperature is smaller than a third predetermined value, and a temperature difference between the second temperature and the ambient temperature is smaller than a fourth predetermined value.

15. The method of claim 14, wherein causing the power dissipation is performed for a predefined second time duration.

16. The method of claim 15, wherein the predefined second time duration is at least three times the thermal time constant of the thermal path.

17. The method of claim 1, wherein the thermal path comprises one or more elements selected from the group consisting of a chip die that the semiconductor device is implemented in, chip solder, a sinter layer, direct bonded copper, copper layers, direct bonded copper ceramic layers, system solder, a base plate, and an adhesive.

18. A device, comprising:

a semiconductor device having at least two output terminals;

a heat sink;

a thermal path configured to thermally couple the semiconductor device to the heat sink; and a test controller configured to:

cause a power dissipation in the semiconductor device by reloading parasitic capacitances of the semiconductor device such that the at least two output terminals of the semiconductor device are at a same voltage level, receive a first measured temperature corresponding to the power dissipation at a first end of a portion of the thermal path, receive a second measured temperature corresponding to the power dissipation at a second end of a portion of the thermal path, and determine a measure of a thermal impedance of the portion of the thermal path based on the first measured temperature and the second measured temperature.

19. The device of claim 18, wherein the test controller is configured to determine the measure of the thermal impedance by calculating a ratio between a power dissipated corresponding to the power dissipation and a difference between the first measured temperature and the second measured temperature.

20. The device of claim 18, wherein the test controller is configured to reload the parasitic capacitances by repeatedly switching on and off one or more transistors of the semiconductor device.

21. The method of claim 3, wherein the parasitic capacitances are parasitic capacitances of the one or more transistors of the semiconductor device.

22. The method of claim 1, wherein measuring the first temperature is performed by a first temperature sensor arranged at the first end of the portion of the thermal path, the first end being mechanically coupled to the semiconductor device, and wherein measuring the second temperature is performed by a second temperature sensor arranged at the second end of the portion of the thermal path, the second end being mechanically coupled to the heat sink.

* * * * *